(12) United States Patent
Kato et al.

(10) Patent No.: US 8,432,661 B2
(45) Date of Patent: Apr. 30, 2013

(54) MICROSTRUCTURAL BODY AND PRODUCTION METHOD THEREFOR

(75) Inventors: Takahisa Kato, Tokyo (JP); Shinichiro Watanabe, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 123 days.

(21) Appl. No.: 13/047,644

(22) Filed: Mar. 14, 2011

(65) Prior Publication Data

US 2011/0228440 A1 Sep. 22, 2011

(30) Foreign Application Priority Data

Mar. 16, 2010 (JP) .................. 2010-058727

(51) Int. Cl.
*H01G 7/00* (2006.01)
(52) U.S. Cl.
USPC ........... 361/277; 361/764; 361/765; 361/784; 361/803; 361/807
(58) Field of Classification Search .......... 361/764–784, 361/803, 807–810
See application file for complete search history.

(56) References Cited

U.S. PATENT DOCUMENTS

| 6,823,747 B2* | 11/2004 | Hasegawa et al. ......... 73/862.52 |
| 6,829,953 B2* | 12/2004 | Ishiguro et al. ............ 73/862.52 |
| 7,024,947 B2* | 4/2006 | Ishiguro et al. .......... 73/862.451 |
| 2008/0100898 A1* | 5/2008 | Kang et al. ..................... 359/224 |
| 2009/0067033 A1* | 3/2009 | Kajino et al. ................. 359/291 |

FOREIGN PATENT DOCUMENTS

JP 2003-150311 A 5/2003

* cited by examiner

*Primary Examiner* — Tuan T Dinh
*Assistant Examiner* — Hung Dang
(74) *Attorney, Agent, or Firm* — Canon USA Inc IP Division

(57) ABSTRACT

A microstructural body includes a substrate such as an electrode substrate, a support portion, one post that fixes the support portion to the substrate, a frame-shaped movable portion provided around outer periphery of the support portion, and an elastic support portion that elastically connects the movable portion and the support portion. The elastic support portion supports the frame-shaped movable portion such that the movable portion is movable relative to the support portion. The elastic support portion includes torsion springs and an elastically deformable connecting portion.

7 Claims, 9 Drawing Sheets

MICROSTRUCTURAL BODY AND PRODUCTION METHOD THEREFOR

BACKGROUND OF THE INVENTION

1. Field of the Invention

The present invention relates to a microstructural body made from a wafer by a semiconductor process, such as micro electro mechanical systems (MEMS), a microstructural body array formed by a plurality of microstructural bodies, and a production method therefor. Here, the term "microstructural body" mainly refers to a structural body that has a minute size of the order of micrometers and that includes a movable portion. For example, the microstructural body can be used in a dynamic quantity sensor (e.g., an acceleration sensor, a pressure sensor, or a gyro sensor), a light deflector, an optical switch, and an optical modulation element.

2. Description of the Related Art

U.S. Patent Application Publication Nos. 2008/100898 A1 and 2009/067033 A1 disclose micro electro mechanical systems (MEMS) used as an actuator and a sensor. For example, a movable portion is provided on a substrate so that the movable portion and the substrate constitute a capacitor having variable electrostatic capacitance. This capacitor can be used as an electrostatic actuator or a sensor for detecting the change in capacitance. Alternatively, a microstructural body is integrated on a substrate including an integrated circuit. Such a microstructural body is used, for example, as a light deflector for deflecting light. Further, a plurality of microstructural bodies are arranged to form an array. In particular, a MEMS device in which a microstructural body including a movable portion with a reflecting surface deflects light in a two-dimensional manner can be used as an optical switch or a spatial intensity or phase modulator.

In a microstructural body of the related art including a movable portion, the spring constant of a torsion spring is changed by the difference in temperature between the microstructural body and a substrate on which the microstructural body is formed and the elongation of the substrate. This makes displacement motion of the movable portion unstable. Further, in a microstructural body including a movable portion capable of two-dimensional torsional displacement, if the spring constants in two torsional displacement directions are decreased, the spring constants in other directions also decrease. Consequently, unnecessary displacement is likely to occur with torsional displacement.

SUMMARY OF THE INVENTION

The present invention provides a microstructural body including a substrate; a support portion; one post that fixes the support portion to the substrate; a frame-shaped movable portion provided around an outer periphery of the support portion; and an elastic support portion that elastically connects the movable portion and the support portion. The elastic support portion includes a frame-shaped connecting portion provided around the outer periphery of the support portion, a first torsion spring, and a second torsion spring. The first torsion spring supports the connecting portion such that the connecting portion undergoes torsional displacement around a first torsion axis relative to the support portion, and the second torsion spring supports the movable portion such that the movable portion undergoes torsional displacement around a second torsion axis relative to the connecting portion. The movable portion includes a movable electrode, and the movable portion and a fixed electrode on the substrate form a capacitor having variable electrostatic capacitance.

According to the microstructural body of the present invention, since the fixed support portion is fixed to the substrate at one center position, it is possible to suppress transmission of stress to the elastic support portion, which elastically connects the frame-shaped movable portion and the support portion, resulting from the difference in elongation between the substrate and the microstructural body. For example, such difference in elongation is caused by the difference in linear expansion coefficient between the substrate and the microstructural body, the temperature difference during use, and deformation of the substrate. If the stress is applied to the elastic support portion including the torsion spring and the elastically deformable connecting portion, the spring constant changes. In the microstructural body of the present invention, only the fixed support portion provided at one center position is fixed to the substrate. Hence, even if the above-described difference in elongation is caused, transmission of the stress from the substrate to the elastic support portion is suppressed. For this reason, it is possible to reduce the change and unevenness of the function of the elastic support portion due to the difference of individual products and use environments, to stabilize the displacement motion of the movable portion, and to suppress unnecessary displacement.

Further features of the present invention will become apparent from the following description of exemplary embodiments with reference to the attached drawings.

DESCRIPTION OF THE EMBODIMENTS

A microstructural body according to the present invention includes a fixed support portion, a frame-shaped movable portion provided around the outer periphery of the fixed support portion, and an elastic support portion that elastically connects the movable portion and the fixed support portion so as to support the movable portion movably relative to the fixed support portion. The fixed support portion is fixed on a substrate at one position. This structure suppresses transmission of the above-described stress to the elastic support portion. As a result, unnecessary displacement of the microstructural body can be suppressed.

Embodiments and examples of the present invention will be described below with reference to the drawings.

Figure 1A:
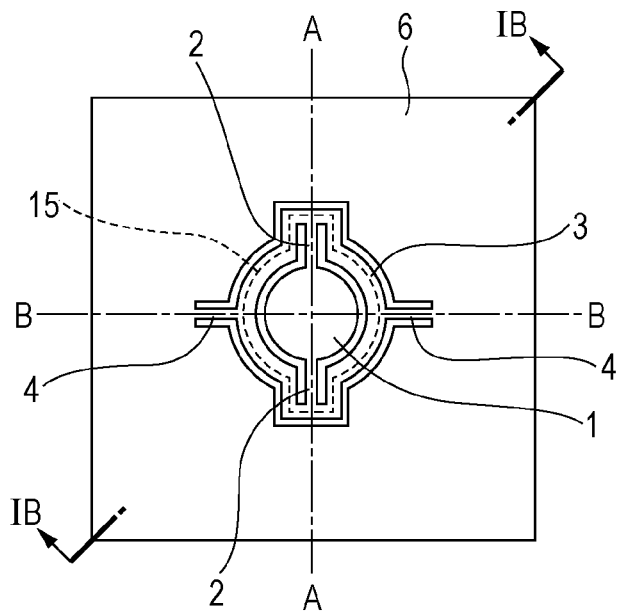
FIGS. 1A, 1B, and 1C illustrate a microstructural body according to an embodiment of the present invention.
Figure 1B:
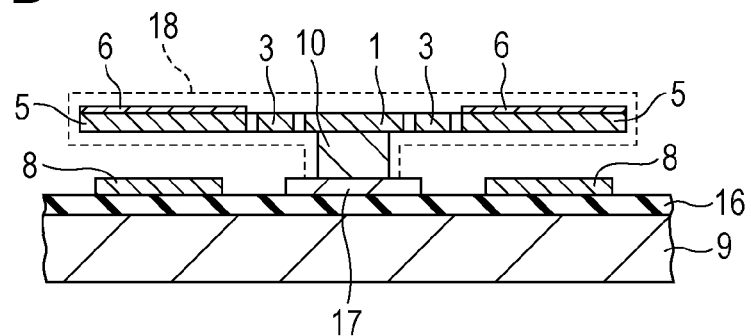
Figure 1C:
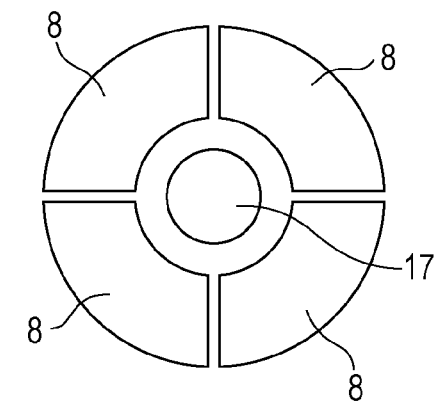

FIGS. 1A to 1C illustrate a microstructural body 18 serving as a MEMS device according to an embodiment of the present invention. FIG. 1A is a top view of the microstructural body 18, FIG. 1B is a cross-sectional view taken along line IB-IB of FIG. 1A, and FIG. 1C is a top view of a portion of an electrode substrate 9 including fixed electrode 8. As illustrated in FIG. 1B, this embodiment adopts the electrode substrate 9 and the microstructural body 18 enclosed by a broken line. A support portion 1 of the microstructural body 18 including a frame-shaped movable portion 5 is fixed on the electrode substrate 9 with a post 10 being disposed therebetween. The post 10 is formed of a conductive material, and electrically connects the support portion 1 to a receiving portion 17 on the electrode substrate 9. The movable portion 5 of the microstructural body 18 is elastically supported in a manner such as to undergo two-dimensional torsional displacement relative to the support portion 1 around line A-A and line B-B of FIG. 1A that serve as a first torsion axis and a second torsion axis, respectively. That is, a frame-shaped connecting portion 3 is elastically supported by first torsion springs 2 such as to undergo torsional displacement relative to the support portion 1 around the line A-A. Further, the movable portion 5 is elastically supported by second torsion springs 4 such as to undergo torsional displacement relative to the connecting portion 3 around the line B-B. By thus connecting the two pairs of torsion springs 2 and 4 by the connecting portion 3, the movable portion 5 can be elastically supported such as to undergo two-dimensional torsional displacement. In this embodiment, the support portion 1 is provided at the center of the MEMS device. The frame-shaped connecting portion 3 having a circumference 15 and the frame-shaped movable portion 5 are arranged in order around the outer periphery of the support portion 1. The torsion springs 2, the torsion springs 4, and the connecting portion 3 are separated by grooves. In this specification, such a characteristic connecting structure is also referred to as a center-fixed gimbal structure. Here, the elastically deformable frame-shaped connecting portion 3 provided around the outer periphery of the support portion 1, the first torsion springs 2, and the second torsion springs 4 constitute an elastic support portion. While the support portion 1 is circular, the connecting portion 3 is annular, and the movable portion 5 is rectangular in the figures, the shapes of these portions can be arbitrarily designed according to the application.

Fixed electrodes 8 are provided on the electrode substrate 9 with an insulating layer 16 being disposed therebetween, and oppose a surface of the movable portion 5 facing the electrode substrate 9 across a fixed space. Therefore, these portions form a capacitor whose electrostatic capacitance is variable according to the displacement of the movable portion 5. As illustrated in FIG. 1B, this space is defined by the height of the post 10 and the thickness of the receiving portion 17. As illustrated in FIG. 1C, the fixed electrodes 8 are shaped like four fans provided around the conductive receiving portion 17. The four fans are separated from one another along the line A-A and the line B-B. When a potential difference is formed between the fixed electrodes 8 and the microstructural body 18, an electrostatic actuator is formed to generate electrostatic attractive force between the fixed electrodes 8 and the movable portion 5. The electrostatic attractive force is generated near positions on the movable portion 5 opposing the fixed electrodes 8. Since these positions are provided apart from the fixed post 10, the electrostatic attractive force serves as a moment that causes torsional displacement of the movable portion 5. The arm of this moment can be set to be relatively long. Since the extending directions of the first and second torsion axes and the separation manner of the fan-shaped fixed electrodes 8 are as described above, when an arbitrary voltage is applied to one or adjacent two of the four fixed electrodes 8, the movable portion 5 can undergo two-dimensional torsional displacement. When a light reflection layer 6 is provided on the movable portion 5, as illustrated, the electrostatic actuator can be used as an optical scanner, an optical switch, or an optical modulation element.

By detecting the change in electrostatic capacitance in response to displacement of the movable portion 5 with a capacitance detection circuit, a sensor can be achieved. By particularly detecting the displacement caused when the movable portion 5 receives external force (e.g., force, acceleration, and angular velocity), a sensor for detecting this force can be achieved.

Advantages of the embodiment will be described in detail with reference to the drawings.

Figure 2A:
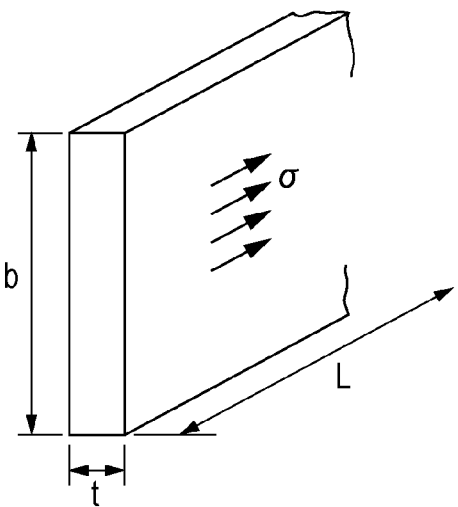
FIGS. 2A, 2B, and 2C illustrate the concept of a torsion spring and an approximate model of a connecting portion.

First, the center-fixed gimbal structure suppresses the change in spring constant due to the difference in usage environment. This advantage is achieved by a structure in which no stress in the torsion axis direction is applied to any of the two pairs of torsion springs. This advantage will be explained with reference to FIG. 2A. FIG. 2A serving as a schematic view illustrating a cross section of a torsion spring. The length of the torsion spring parallel to the torsion axis is designated as L, and the width t and thickness b of the cross section are defined, as illustrated in FIG. 2A. Assuming that a stress σ in the torsion axis direction is applied, a torsion spring constant K is approximated by the following Relational Expression (1):

$$K = (Gbt^3/3L) \times (1 + (b^2/4Gt^2) \times \sigma) \qquad (1)$$

where G represents the transverse elastic modulus of the material. As shown by Expression (1), the torsion spring constant K changes according to the stress σ. The stress σ is generated by expansion and contraction of the torsion spring caused by the difference in deformation amount between the electrode substrate 9 and the microstructural body 18. This difference in deformation amount is formed by deformation of the electrode substrate 9 during the production procedure or deformation at the time of fixing to an apparatus. These deformations vary among individual products. Further, in the case of a light deflector, it is conceivable that the temperatures of the microstructural body 18 and the electrode substrate 9 are increased by light irradiation. If the temperatures increase, the elongation amounts of the microstructural body 18 and the electrode substrate 9 are different because of the difference in linear coefficient of expansion and difference in temperature therebetween. Therefore, the stress σ changes according to the light irradiation condition. In addition, when the use environmental temperature changes and when heat is absorbed from the back surface to cool the microstructural body, the difference in elongation amount between the microstructural body 18 and the electrode substrate 9 differs among the environments, and this also changes the stress σ. Therefore, the torsion spring constant K is also changed by these factors.

In contrast, according to the center-fixed gimbal structure, the microstructural body 18 is fixed on the electrode substrate 9 by one post 10. Each of the first and second torsion springs 2 and 4 merely extends outward at one end, and is not fixed to the electrode substrate 9 at any point. Therefore, the stress σ in the torsion axis direction due to deformation of the electrode substrate 9 is not transmitted to the two pairs of torsion springs. That is, since little stress σ is produced in the first and second torsion springs 2 and 4, the change of the torsion spring constant due to this factor can be suppressed. This advantage can be obtained as long as the support portion is fixed to the substrate only at one center point as in the center-fixed gimbal structure.

The spring constant of the torsion spring with a high cross-section aspect ratio is greatly changed by the stress in the torsion axis direction. In this embodiment, however, no stress is transmitted from the electrode substrate, and therefore, the change of the spring constant can be suppressed even when such a torsion spring is used. Further, since the torsion spring constant is not influenced by the stress from the substrate, even if the temperature changes in the microstructural body and the electrode substrate because of light irradiation, the change of the torsion spring constant due to the stress can be suppressed. For this reason, even when high power light is deflected, stable operation is possible. Moreover, since the stress is not transmitted from the electrode substrate, it is possible to remove the stress cause of variations in spring constant among a plurality of microstructural bodies. For example, to use the electrostatic actuator as an optical modulator, it is possible to restrain undesired diffracted light from being produced by eccentricity of deflection axes of adjacent microstructural bodies. In contrast, to use the electrostatic actuator as a light deflector array, movable micromirrors are arranged to form a mirror array. By individually and accurately controlling the displacement amounts of the mirrors, light applied to the mirror array can be deflected to a desired position (or shape). Such a mirror array enables maskless exposure. In addition, when a larger array is formed, variations in spring constant among microstructural bodies and change with time can be reduced. Particularly when the area of the array is large, the temperature in the array and deformation of the substrate are more likely to vary. However, the structure of the embodiment advantageously reduces the adverse influence of such variation.

Secondly, the embodiment can reduce unnecessary displacement that occurs with two-dimensional torsional displacement. Especially, the embodiment can reduce displacement in a direction in which the movable portion 5 and the electrode substrate 9 move closer to each other while being in parallel. This direction corresponds to the direction of the normal to a plane including the first torsion axis and the second torsion axis, and is especially referred to as a vertical direction. Displacement in this direction can be suppressed by increasing the vertical spring constant of the microstructural body and decreasing the vertical force that is generated together with driving torque. This advantage will now be described with reference to FIGS. 2B, 2C, and 3 and FIGS. 4A to 4C illustrating a comparative example. FIGS. 4A to 4C illustrate a MEMS device of a comparative example that undergoes two-dimensional torsional displacement. FIG. 4A is a top view of the MEMS device, FIG. 4B is a cross-sectional view taken along line IVB-IVB of FIG. 4A, and FIG. 4C is a top view of a portion of an electrode substrate including fixed electrodes. Portions having the same functions as those in the embodiment are denoted by the same reference numerals. A spacer 21 supports a support portion 1. The relational relationships among the support portion 1, a connecting portion 3, and a movable portion 5 are inverse between the embodiment and the comparative example. That is, in contrast to the center-fixed gimbal structure of the embodiment, the connecting portion 3 and the support portion 1 are provided to surround the outer periphery of the movable portion 5 in the comparative example.

First, a description will be given of the fact that the center-fixed gimbal structure can increase the vertical spring constant of the microstructural body. Since the movable portion 5 serves as a movable electrode of the capacitor, it is necessary to increase the size of the movable portion 5 in order to increase the change in electrostatic capacitance. When the MEMS device is used as a light deflector, the movable portion 5 is provided with a light reflecting surface, and therefore, the size of the movable portion 5 needs to be increased for a higher aperture ratio. Accordingly, it is difficult for the comparative example to form a connecting portion 3 having a small circumference 15. In contrast, in the embodiment, the circumference 15 does not depend on the size of the movable portion 5, as illustrated in FIG. 1A. That is, in the embodiment, a larger movable portion 5 can be formed without increasing the circumference 15 of the connecting portion 3. Particularly when the area of the movable portion 5 viewed in the vertical direction is larger than the area of the elastic support portion viewed in the vertical direction, the ratio of the area of the movable portion 5 to the total size of the microstructural body can be increased. In the present invention, "an area viewed in a direction X" refers to the projection area in the direction X. Since this structure can increase the area of the movable portion, the microstructural body can be driven at low voltage. Further, when the movable portion having the reflecting surface performs optical deflection and modulation, an effective aperture ratio can be increased.

Figure 2B:
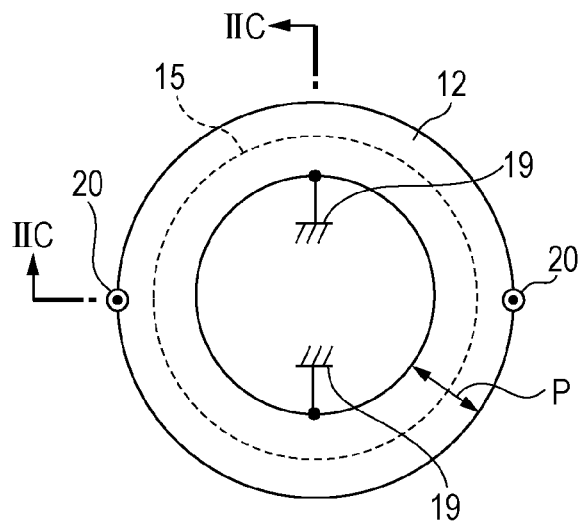
Figure 2C:
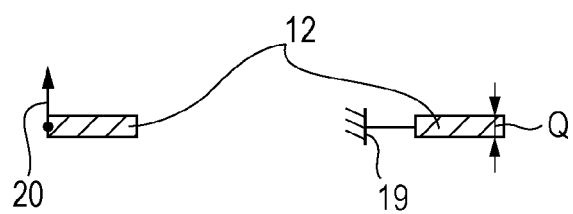
Figure 3:
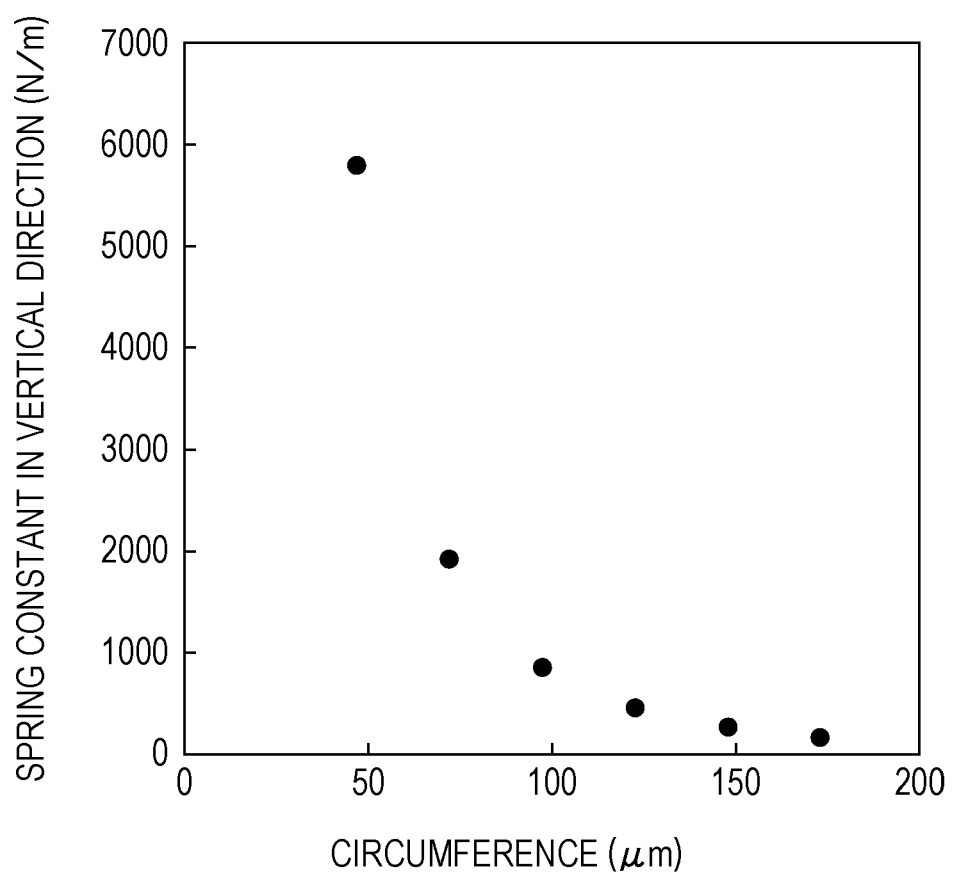
FIG. 3 is a graph showing the relationship between the circumference of the connecting portion and the vertical spring constant.
Figure 4A:
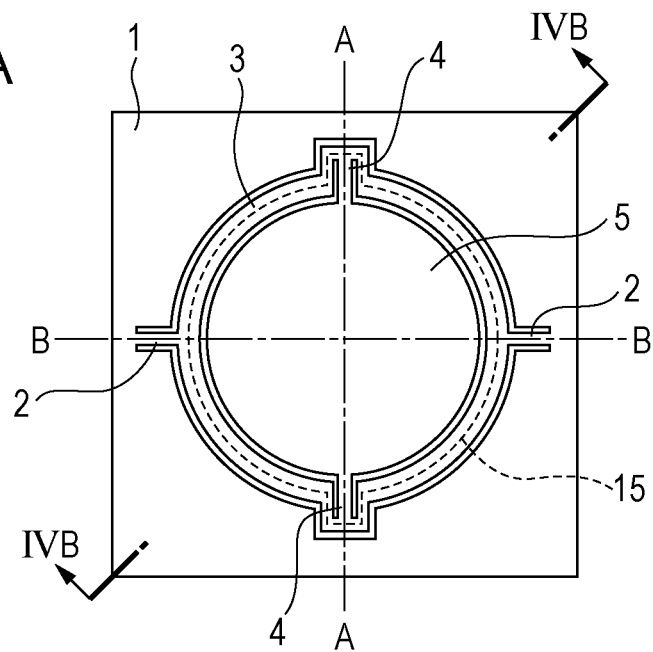
FIGS. 4A, 4B, and 4C illustrate a microstructural body as a comparative example.
Figure 4B:
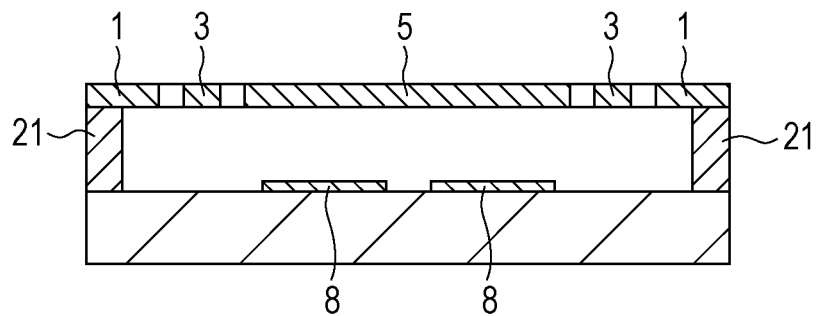
Figure 4C:
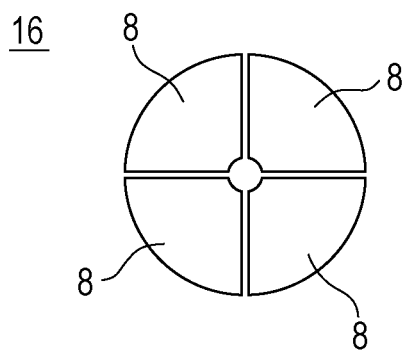

With reference to FIGS. 2B, 2B, and FIG. 3, a description will be given of the fact that the vertical spring constant can be markedly increased by decreasing the circumference 15. FIG. 2B is a top view of an approximate model 12 of the connecting portion 3, and FIG. 2C is a cross-sectional view taken along line IIC-IIC of FIG. 2B. To clearly explain the relationship between the circumference 15 of the frame-shaped connecting portion 3 and the vertical spring constant, it is assumed that the approximate model 12 is shaped like a doughnut having a width P and a thickness Q. This approximately illustrates a balanced state of the connecting portion 3 due to vertical force while the movable portion 5 is in a torsional displacement state in the two-dimensional torsional displacement mechanism including the connecting portion 3 illustrated in FIG. 1A. The positions of fixed ends 19 and test loads 20 correspond to the positions where the first torsion springs 2 and the second torsion springs 4 are connected to the connecting portion 3 in FIG. 1A. By the electrostatic attractive force between the fixed electrodes 8 and the movable portion 5A, a vertical force is applied together with driving torque, whereby the connecting portion 3 is displaced in the vertical direction via the second torsion springs 4. This force corresponds to the test loads 20 in the approximate model. The connecting portion 3 is fixed to the support portion 1 with the first torsion springs 2 being disposed therebetween at positions corresponding to the fixed ends 19 in the approximate model. Therefore, the spring constant of the approximate model 12 using the test loads 20 corresponds to the spring constant with respect to unnecessary vertical displacement of the elastic support portion during two-dimensional torsional displacement, that is, the spring constant of the connecting portion 3 of the vertical spring constants. The vertical spring constant of the approximate model 12 increases as the width P and the thickness Q increase and as the circumference 15 decreases. Although the width P needs to be small in order to increase the size of the movable portion 5 for a higher light aperture ratio and a larger electrostatic capacitance, this decreases the vertical spring constant of the connecting portion 3. Further, the upper limit of the thickness Q is determined by the production method because there is a microfabrication limit to the thickness. From the above, the vertical spring constant of the MEMS device that undergoes two-dimensional torsional displacement is preferably increased by decreasing the circumference 15. If the circumference 15 is long as in the comparative example, the spring constant of the connecting portion 3 is the smallest among the vertical spring constants of the elastic support portion (that is, a total spring constant of three spring constants of the first torsion springs 2, the second torsion springs 4, and the connecting portion 3). Thus, unnecessary displacement is mainly caused by deformation of the connecting portion 3. Since the vertical spring constant of the connecting portion 3 can be made larger than the vertical spring constants of the two pairs of torsion springs by decreasing the circumference 15, unnecessary displacement of the elastic support portion can be reduced effectively.

Here, concrete calculated values will be given. As an example, the connecting portion 3 is formed of single-crystal silicon that is able to be microfabricated, and has a width P of 3 µm and a thickness Q of 1.6 µm. FIG. 3 shows calculation results of vertical spring constants obtained when the circumference is changed from 47 µm (corresponding to an inner diameter of 12 µm) to 173 µm (corresponding to an inner diameter of 52 µm). As shown in FIG. 3, the vertical spring constant decreases in proportion to about the −2.8 power of the circumference. It is shown that the vertical spring constant markedly increases as the circumference 15 decreases. Since the circumference 15 of the connecting portion 3 is not influenced by the movable portion 5 in the center-fixed gimbal structure, the circumference 15 can be decreased while increasing the size of the movable portion 5. This allows the vertical spring constant to be improved while increasing the change in electrostatic capacitance and the light aperture ratio. In a modification of the comparative example, when the vertical spring constant is small, a pivot structure in which the movable portion 5 is supported by contact from the electrode substrate 9 side is adopted. However, the above-described center-fixed gimbal structure does not need such a contact structure. For this reason, in the embodiment, repetitive displacement will not cause abrasion of the contact portion and change in frictional resistance at the contact portion. This allows a MEMS device having high driving stability.

Next, a description will be given of the fact that the center-fixed gimbal structure can reduce the vertical force accompanying the driving torque when the MEMS device is used as an actuator. The fixed electrodes 8 in the center-fixed gimbal structure and the comparative example will be compared with reference to FIGS. 1A to 1C and 4A to 4C. In the center-fixed gimbal structure illustrated in FIGS. 1B and 1C, the movable portion 5 serving as the movable electrode for applying electrostatic torque is provided on the outermost periphery of the microstructural body, and the fixed electrodes 8 are arranged at the positions corresponding to the movable portion 5. Therefore, an electrostatic attractive force can act at the positions provided apart from the torsion axes A-A and B-B, and a great driving torque can be generated by a small electrostatic attractive force. Thus, the center-fixed gimbal structure can properly reduce the vertical electrostatic attractive force owing to two-dimensional torsional displacement. Also, since a great driving torque can be obtained by a small electrostatic attractive force, two-dimensional torsional displacement can be produced at low voltage. In addition, when the MEMS device is used as a sensor, the change in electrostatic capacitance per unit torsional displacement can be increased by a small area, because the distance between the point of action and the torsion axis is long.

In contrast, in the comparative example illustrated in FIGS. 4B and 4C, the movable portion 5 is provided near the center where the two torsion axes A-A and B-B intersect. Torques around the torsion axes A-A and B-B of the electrostatic attractive force between the fixed electrodes 8 and the movable portion 5 serve as driving torques in the direction of torsional displacement. For this reason, a long distance is not provided between the point of action of the electrostatic attractive force and the torsion axes A-A and B-B, and it is therefore difficult to reduce the vertical electrostatic attractive force owing to two-dimensional torsional displacement.

From the above, the rigidity of the connecting portion can be increased by the small area, and unnecessary displacement in directions other than the direction of torsional displacement of the microstructural body can be reduced. Further, since the two pairs of torsion springs having different torsion axes are connected by the connecting portion, the torsion springs can be easy to twist and difficult to bend. In particular, by increasing the aspect ratio of the cross sections of the torsion springs so as to increase the rigidity in the longitudinal direction, the maximum permissible twist angle of the torsion springs can be increased, and the torsion springs are difficult to bend. For example, when the MEMS device is used as a light deflector, accurate deflection can be performed with little eccentricity and tilting of the axis for deflecting the light because the torsion springs are easy to twist and difficult to bend.

Thirdly, a description will be given of the fact that the center-fixed gimbal structure enables two-dimensional torsional displacement at low voltage. This can be achieved by making the torsion springs, which produce two-dimensional torsional displacement, easy to twist and difficult to bend and placing the point of action of electrostatic attractive force apart from the torsion axes. The advantage of the point of action of the electrostatic attractive force is described above. The structure of the torsion springs that are easy to twist and difficult to bend will be described by taking the torsion spring illustrated in FIG. 2A as an example. This structure can be realized by decreasing the width t and increasing the thickness b so as to increase the aspect ratio of the cross section or decreasing the length L. However, if the length L is decreased, the maximum twist angle is limited. Hence, to obtain a spring that has a large maximum twist angle and that is difficult to bend, it is preferable to increase the aspect ratio of the cross section. In this case, while the influence of the stress σ is large in the comparative example, as in the above Expression (1), the use of the center-fixed gimbal structure can greatly reduce the change in stress σ for the above-described reason. Thus, the torsion spring constant can be stabilized.

From the above, when the embodiment is used as the actuator, the moment arm of the torque owing to the electrostatic force is large, a great driving torque can be obtained by a small electrostatic force, and the torsion spring constant can be small. This enables low-voltage driving. Since low-voltage driving is possible, when an array is formed, a driving circuit for driving the array can be simplified. Further, an insulating structure between leads for driving the array can be simplified. Moreover, the influence of current leakage between the leads can be reduced. In addition, when the MEMS device is used as a sensor, the change in electrostatic capacitance per displacement angle of the movable portion can be increased, and this increases sensitivity.

A torsion spring formed of single-crystal silicon has a substantially ideal elastic characteristic. Hence, it is possible to reduce the drift of torsional displacement resulting from repetitive curing, plastic deformation at deformation of the spring, and stress relaxation (creep strain caused in a short time). In particular, since single-crystal silicon can be subjected to microfabrication, it is possible to precisely produce torsion springs of the order of micrometers. For this reason, production variation of the spring constant can be reduced.

Further, since a spring having a cross section with a high aspect ratio can be produced, the spring can be easy to twist and difficult to bend. Therefore, in the case of a micromirror array, mirrors with reduced drift of the light deflection angle can be produced. In addition, since production variation of the micromirror arrays and variation in driving voltage can be reduced, a spatial phase or intensity modulator with little driving fluctuation can be obtained.

More concrete examples will be described below.

FIRST EXAMPLE

Figure 5A:
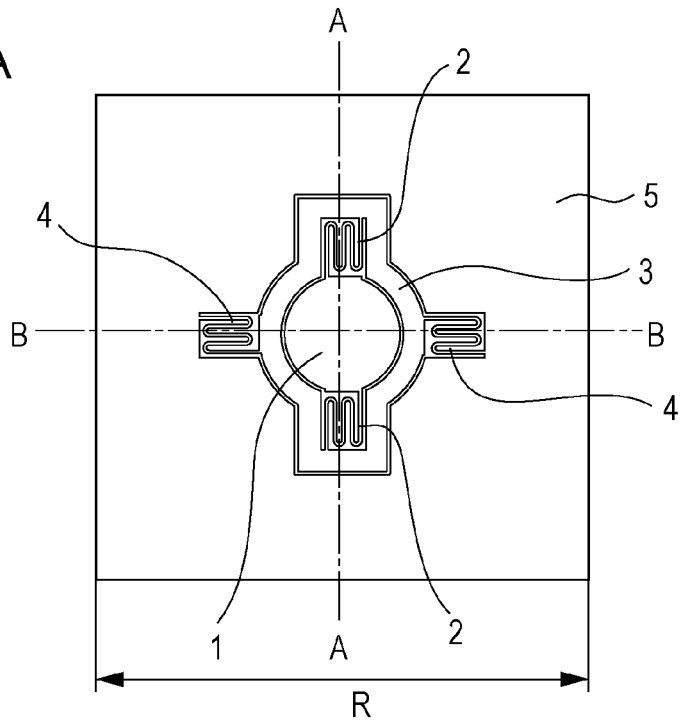
FIGS. 5A, 5B, and 5C illustrate a microstructural body and a microstructural body array according to a first example of the present invention.
Figure 5B:
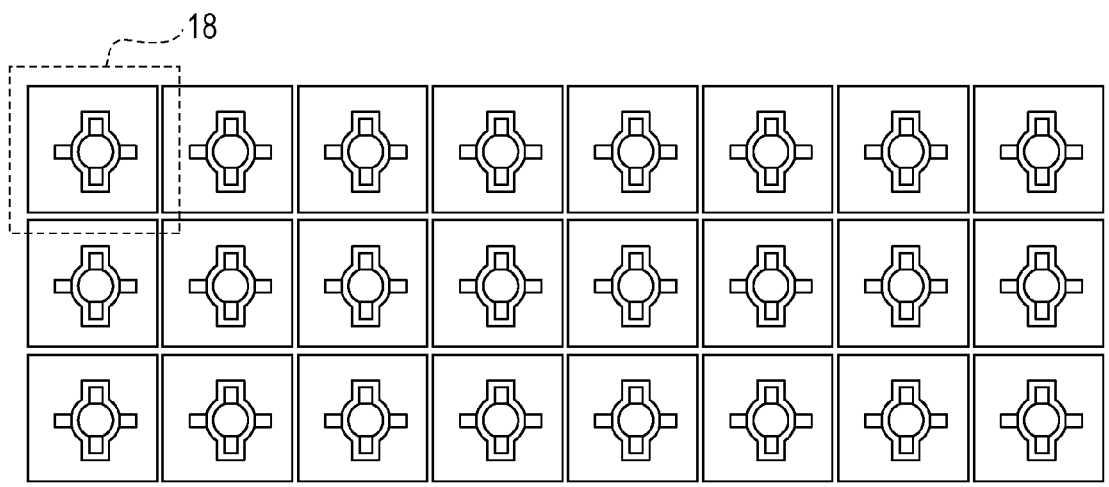
Figure 5C:
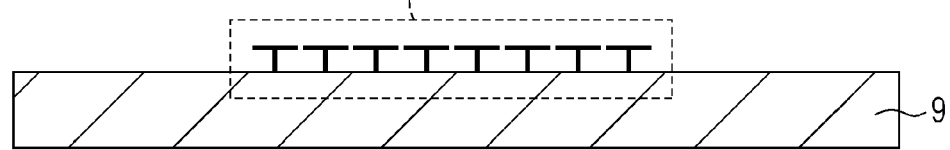

A microstructural body array 22 according to a first example of the present invention will be described with reference to FIGS. 5A to 5C. FIG. 5A is a top view of each microstructural body 18 of the first example, FIG. 5B is a top view of the microstructural body array 22, and FIG. 5C is a cross-sectional view of the microstructural body array 22. Portions having the same functions as those adopted in the above-described embodiment are denoted by the same reference numerals, and detailed descriptions thereof are omitted.

In the first example, two pairs of torsion springs 2 and 4 that constitute a center-fixed gimbal structure each have a meandering structure, as illustrated in FIG. 5A. Each microstructural body 18 has the same cross-sectional structure as in FIG. 1B. As illustrated in FIGS. 5B and 5C, a plurality of microstructural bodies 18 of FIG. 5A are arranged on an electrode substrate 9 to form a microstructural body array 22. As in the above-described embodiment, the electrode substrate 9 has fixed electrodes 8 corresponding to the microstructural bodies 18. The electrode substrate 9 incorporates a driving circuit formed by a semiconductor integrated circuit, and can control the voltage to be applied to the fixed electrodes 8 of the microstructural bodies 18. Since the electrode substrate 9 incorporates the driving circuit, the number of lines for controlling the fixed electrodes 8 in the array can be reduced. In the first example, a support portion 1, first torsion springs 2, a connecting portion 3, second torsion springs 4, and a movable portion 5 are integrally formed of single-crystal silicon. Further, both a post 10 and a receiving portion 17 are formed of gold.

The length of one side R of each microstructural body 18 is 64 μm, and the thickness of the microstructural body 18 is 1.6 μm. The diameter of the post 10 is 10 μm, the diameter of the support portion 1 is 15 μm, and the width of the connecting portion 3 is 3 μm. The intervals between adjacent microstructural bodies 18 and the intervals (gaps) that separate the support portion 1, the first torsion springs 2, the connecting portion 3, the second torsion springs 4, and the movable portion 5 are 0.5 μm. In each of the torsion springs 2 and 4 having the meandering structure, linear portions folded back are 0.5 μm in width in the direction perpendicular to the torsion axis direction, and 5 μm in length. A gap of 4 μm is provided between the movable portion 5 and the fixed electrodes 8. The microstructural body array 22 is formed by a 32 by 32 matrix of microstructural bodies 18, that is, 1024 microstructural bodies 18. Each microstructural body 18 includes four fixed electrodes 8. By applying a voltage up to 40 V to the fixed electrodes 8, two-dimensional torsional displacement can be independently caused in each movable portion 5 at a displacement angle up to ±1 degree. The vertical spring constant of the connecting portion 3 is about 2.3 times the vertical spring constants of the first torsion springs 2 and the second torsion springs 4. This microstructural body array 22 is irradiated with light so as to serve as a spatial intensity or phase modulator. The microstructural bodies of the first example can provide the same advantages as those of the above embodiment.

SECOND EXAMPLE

Figure 6A:
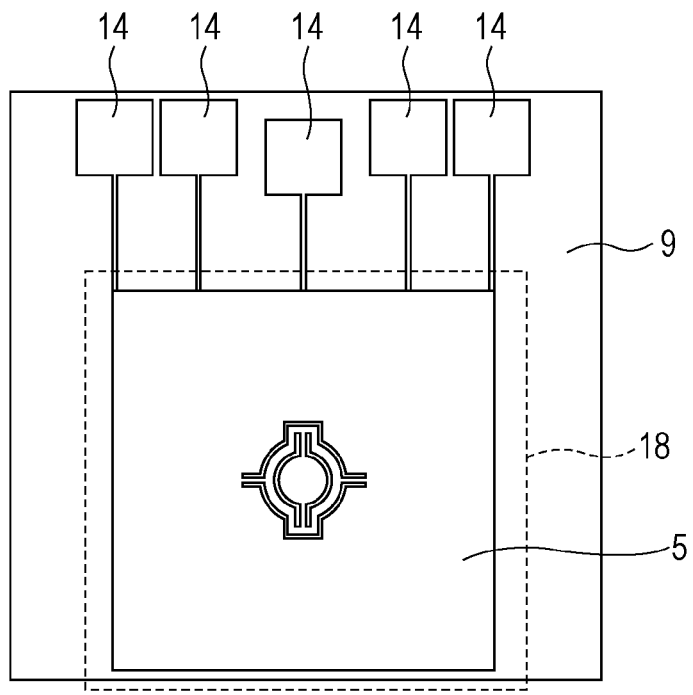
FIGS. 6A and 6B illustrate a microstructural body according to a second example of the present invention.
Figure 6B:
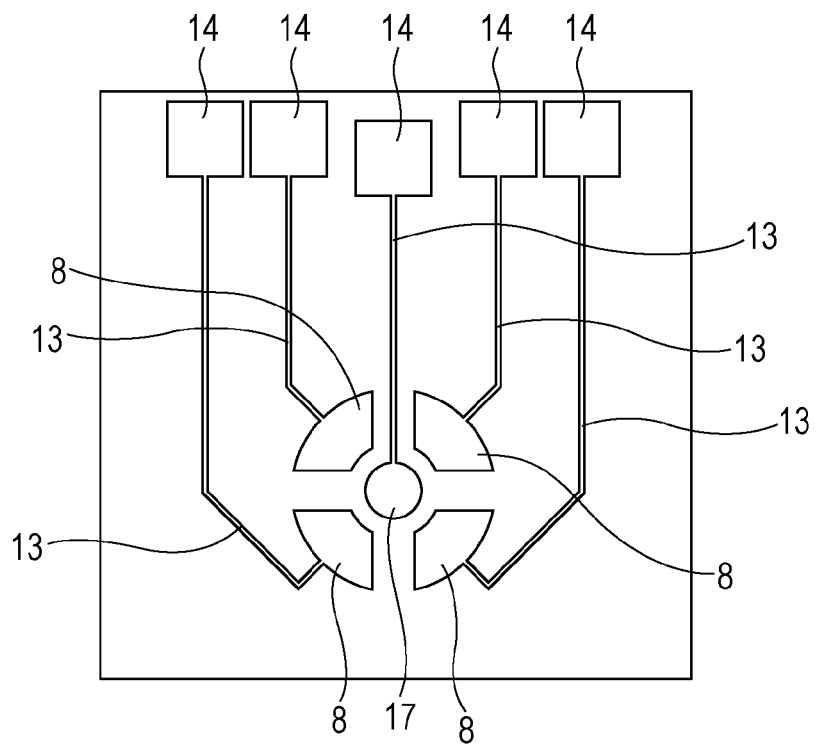

A microstructural body according to a second example of the present invention will be described with reference to FIGS. 6A and 6B. FIG. 6A is a top view of a MEMS device of the second example, and FIG. 6B is a top view of an electrode substrate 9. Portions having the same functions as those adopted in the embodiment and the first example described above are denoted by the same reference numerals, and detailed descriptions thereof are omitted. In the second example, the electrode substrate 9 is provided with one microstructural body 18. On the electrode substrate 9, fixed electrodes 8 and a receiving portion 17 are provided with leads 13 and electrode pads 14, as illustrated. By electrically connecting the electrode pads 14 to a driving circuit, two-dimensional torsional displacement can be caused in the microstructural body 18.

The length of one side of the microstructural body 18 is 250 μm, and the diameter of a post 10 is 30 μm. A gap of 10 μm is provided between a movable portion 5 and the fixed electrodes 8. Thus, two-dimensional torsional displacement can be caused in the movable portion 5 at a displacement angle up to ±2.5 degrees. By light irradiation, the microstructural body 18 can serve as a small light deflector. The angle can be held by the application of a fixed voltage. Further, optical scanning can be performed by applying an alternating voltage near the resonance frequency of the microstructural body 18. Since the center-fixed gimbal structure does not include a structure for supporting the movable portion by contact, the movable portion 5 can be driven at a high amplitude amplification factor even in resonant driving. Further, even if the environmental temperature changes, the torsion spring constant is not changed by the influence of stress from the fixed electrodes 8. For this reason, it is only necessary to set the change in spring constant in consideration of only the change in Young's modulus and expansion of the material that forms the springs, and it is easy to estimate the changes in resonance frequency due to the environmental temperature and the change in spring constant. As a result, the control accuracy is increased, and the control method and the control circuit can be simplified. In particular, since the scanning performance can thus be stabilized even if the environmental temperature changes, a small optical device having no temperature control mechanism can be formed using a small light deflector.

According to the MEMS device of the second example, it is unnecessary to lead the lines from the fixed electrodes 8 and the movable electrode (movable portion 5) to the external driving circuit in a one-to-one correspondence. This allows a large-scale array with a reduced number of lines and a large number of microstructural bodies. When the MEMS device is used as a sensor, a line connecting a capacitor to be detected and a detection circuit can be shortened, and therefore, noise is reduced.

THIRD EXAMPLE

Figure 7A:
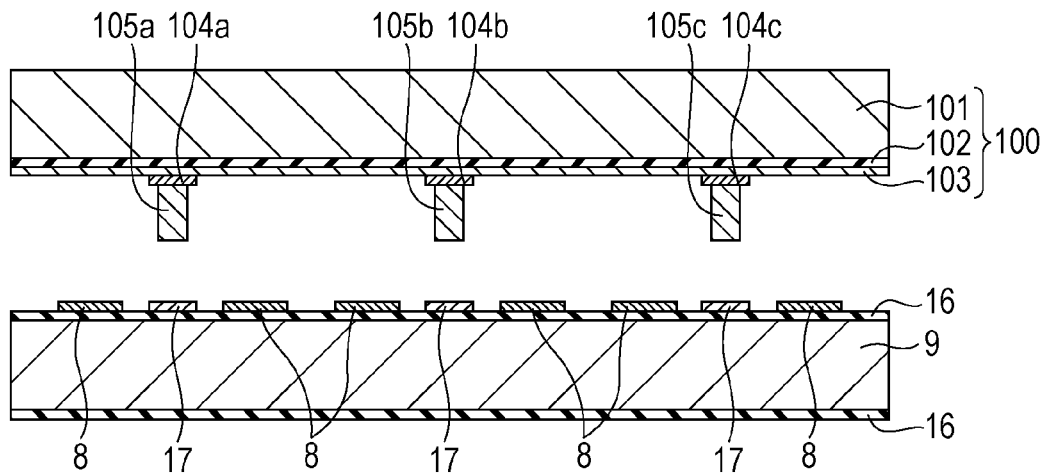
FIGS. 7A, 7B, and 7C illustrate a microstructural body array production method according to a third example of the present invention.
Figure 7B:
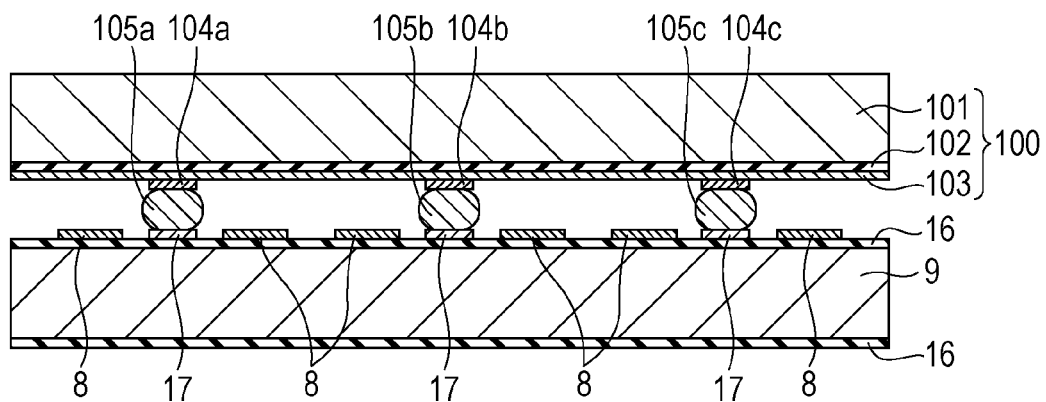
Figure 7C:
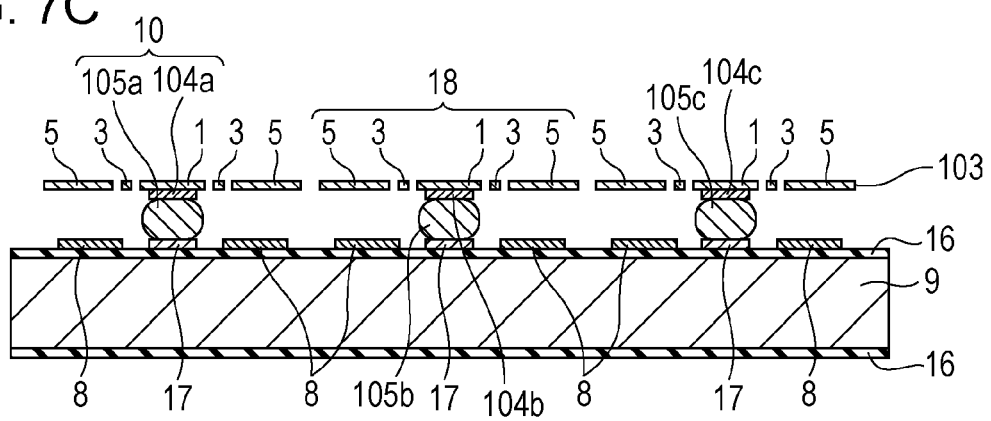

A production method for a microstructural body array (for example, used as a micromirror array) according to a third example of the present invention will be described with reference to FIGS. 7A to 7C. FIGS. 7A to 7C are cross-sectional views of microstructural bodies taken along line IB-IB of FIG. 1A, and a procedure for producing a microstructural body array including three microstructural bodies will be described here. Referring to FIG. 7A, an SOI substrate (device substrate) 100 including a device layer 103 in which a center-fixed gimbal structure is to be formed later has an SOI (silicon on insulator) structure of single-crystal silicon.

A description will be given of a step of forming bumps 105a to 105C (hereinafter collectively referred to as bumps 105) on the device layer 103 by Au plating. First, seed portions 104a to 104c (collectively referred to as seed portions 104) are formed. Here, each seed portion 104 is formed by two layers of Au and Cr. The Cr layer is provided to improve the adhesion between silicon of the device layer 103 in the SOI substrate 100 and Au and to serve as a barrier layer for reducing interdiffusion of Au of the bump 105 and silicon. The Au and Cr layers can be formed by sputtering or vapor deposition. The thickness of the Cr layer is 30 to 50 nm and the thickness of the Au layer is 200 to 400 nm. Alternatively, the effect of reducing interdiffusion can be enhanced by adopting a three-layer structure of Cr, Pd, and Au. After the Au and Cr layers are formed, seed portions 104 for microstructural bodies are formed by etching. After the seed portions 104 are formed, a pattern for Au plating is formed using a thick film resist for plating, and bumps 105 for the microstructural bodies are then formed by plating. In this case, electroplating can be formed by passing current through the seed portions 104. In the third example, the bumps 105 are shaped like columns having a height of 10 μm and a diameter of 10 μm. Before Au plating, a TiW film may be formed to reduce interdiffusion of Au of the bumps and silicon. In contrast, fixed electrodes 8 and receiving portions 17 are formed on an insulating layer 16 of single-crystal silicon on an electrode substrate 9. Similarly to the seed portions 104 on the device layer 103, the fixed electrodes 8 and the receiving portions 17 are each formed by two layers of Au and Cr. To form the fixed electrodes 8 and the receiving portions 17, Au and Cr films are formed and patterned. The wiring material is not limited to the two-layer structure of Au and Cr, and a three-layer structure of Au, Pd, and Cr may be adopted. The material of the bumps 105 is also not limited to Au, and may be an easily crushable material, for example, Cu, Al, or AuSn. The material of the bumps 105 is not limited to one material, and the bumps 105 may have a two-layer structure in which an Au-plated layer is formed on a Cu-plated layer. The shape of the bumps 105 is not limited to the above-described columnar shape, and may be a prismatic shape, such as a rectangular parallelepiped or a triangular prism, or a polygonal shape. The electrode material is not limited to Au and Cr, and may be formed of materials used in common integrated circuits. Further, the fixed electrodes 8 and the receiving portions 17 described above may be provided on an integrated circuit substrate. In this case, since it is unnecessary to lead out lines to the external driving circuit, the number of lines can be reduced, and a large-scale array with a high integration density can be configured easily. The above-described numerical values are just exemplary, and other numerical values can be used. In the above procedure, it is only necessary that metal projections, such as bumps, serving as connecting portions are formed on one of the device substrate and that the electrode substrate and receiving portions, such as pads, for joint to the projections are formed on the other. Hence, the substrate having the bumps and the substrate having the receiving portions may be formed by a method opposite to the above-described production method. The above-described steps correspond to a projection forming step of forming metal projections serving as posts on one of the two substrates and a receiving-portion forming step of forming receiving portions to be joined to the projections on the other substrate in the production method for the microstructural body.

Next, cleaning and activation are performed by activation for applying argon plasma to joint surfaces of the bumps 105 on the SOI substrate 100 and joint surfaces of the receiving portions 17 on the electrode substrate 9 in a vacuum chamber. Since water and dust can be removed from the joint surfaces in this activation step, bonds of atoms on the surfaces can be directly coupled, and firm joint can be achieved at ordinary temperature. Cleaning and activation may be performed by applying an argon beam or an atom beam. Gas used in the activation step may be an inert gas such as nitrogen or helium. Next, a surface of the SOI substrate 100 on which the bumps 105 are provided and a surface of the electrode substrate 9 on which the receiving portions 17 are provided are placed to face each other, and are aligned for joint by alignment marks (not illustrated) provided on the substrates. Then, as illustrated in FIG. 7B, the SOI substrate 100 and the electrode substrate 9 are pressurized at ordinary temperature so that the bumps 105 are pressed against the receiving portions 17, thereby performing joint to form a space between the SOI substrate 100 and the electrode substrate 9. For example, the substrates are pressurized with a load of 25 to 50 kgf for three hundred seconds at ordinary temperature. Here, the term "ordinary temperature" refers to the temperature ranging from the room temperature to 100° C. The above-described step corresponds to a step of placing two substrates so that the surfaces thereof on which the projections and the receiving portions are provided face each other, aligning the substrates so that the projections and the receiving portions can be joined, pressing the projections against the receiving portions to form a space between the two substrates, and joining the projections and the receiving portions at ordinary temperature.

In the joint step of the third example, the SOI substrate 100 and the electrode substrate 9 are joined by being pressed at ordinary temperature, and therefore, the upper and lower substrates do not thermally expand at the time of joint. That is, unlike the case in which the upper and lower substrates are joined while being heated, the difference in elongation between the substrates due to the difference in thermal expansion therebetween can be reduced. Therefore, the joined upper and lower substrates are not misaligned, and can be joined at high accuracy.

Further, since the bumps 105 are crushed during joint, joint is always performed at new surfaces of the bumps 105. That is, the bonds of the atoms on the joint surfaces are directly coupled, and this allows firmer joint. Moreover, since joint can be performed beyond dust that is smaller than the final size of the crushed bumps 105, the yield of the joint step can be improved. In consideration of the amount by which the bumps 105 are crushed and extended by the receiving portions 17 serving as the pads and alignment errors produced during joint, the size relationship between the bumps 105 and the receiving portions 17 is preferably set so that the receiving portions 17 are larger than the bumps 105. For example, each side of the receiving portions 17 is made to be larger by 10 μm or more than the bumps 105. The diameter of the support portion 1 is larger than that of the post 10. Hence, even if the post 10 is displaced within the area of the support portion 1 during the production procedure, there is no influence on the positions where the first torsion springs 2 are fixed (see FIG. 1). Further, since the space between the SOI substrate 100 and the electrode substrate 9 is determined by the amount by which the bumps 105 are crushed, a desired space can be obtained by adjusting the height and width (shape) of the bumps 105 and the pressing force. Since the number of bumps has an influence on the amount of crush, it is a parameter necessary to control the space. In addition, since the substrates are joined in a planar state in the third example, the entire substrates can be pressed with a uniform force, so that a uniform space can be formed between the SOI substrate 100 and the electrode substrate 9.

Next, as illustrated in FIG. 7C, thinning is performed by removing a handle layer 101 and a SiO₂ layer 102 of the SOI substrate 100 by wet etching or dry etching so that only the device layer 103 is left. After that, fixed support portions 1, first torsion springs 2, connecting portions 3, second torsion springs 4, and movable portions 5 are formed by photolithography and etching. As illustrated, the seed portions 104 and the bumps 105 correspond to posts 10 that fix the fixed support portions 1 to the electrode substrate 9. The above-described step corresponds to a step of working one of the two substrates so as to form microstructural bodies each including a support portion, a movable portion, and an elastic support portion. In the above-described manner, a microstructural body array is formed on the electrode substrate 9.

According to the MEMS device of the third example, since the posts are formed of gold having high thermal conductivity, even if heat is generated in the microstructural body by light absorption, the heat can be transferred to the electrode substrate. For this reason, the temperature rise of the microstructural body can be suppressed. Moreover, since a good thermal connection is possible, the temperature can be properly adjusted from the electrode substrate side. In particular, since the posts are formed of gold, firm joint can be obtained by coupling of gold and gold at ordinary temperature. This makes it possible to produce a MEMS device with firm mechanical connection. In addition, since the electrical resistance of gold is low, a good electrical connection is also achieved. Since the posts 10 are formed of gold in this way, the microstructural bodies 18 and the electrode substrate 9 can be properly connected in electrical, thermal, and mechanical manners.

Further, the MEMS device can be formed by joining the electrode substrate and the microstructural body that are produced separately. By separately producing the electrode substrate and the microstructural body, the yield of the MEMS device can be enhanced. Further, even if the electrode substrate is uneven, it does not have any influence on flatness of the microstructural bodies. Hence, a flat capacitor gap can be formed without performing a planarization step such as polishing. In addition, since a great temperature rise does not occur during joint, warping and elongation of the electrode substrate and the microstructural bodies during joint can be reduced, and this allows the microstructural bodies and the electrode substrate to be joined at high positional accuracy. Particularly when an array is formed by a plurality of microstructural bodies, positional variation of the movable electrodes (movable portions) and the fixed electrodes among the microstructural bodies can be reduced. For this reason, when the array is used as an electrostatic actuator, variation in driving voltage can be reduced. When the array is used as a sensor, variation in detection capacitance can be reduced. The array is joined to an electrode substrate having a driving circuit without degrading the driving circuit characteristic, because a great temperature rise does not occur.

In the third example, a structural-body dividing step is performed after the device layer and the electrode substrate are joined. For this reason, the structural-body pattern of the device layer can be aligned with the electrode substrate at an alignment accuracy of a typical aligner, and the microstructural bodies can be formed relative to the fixed electrodes at high accuracy. As a result, the driving of the structural bodies can be accurately controlled with respect to the driving voltage. Since the alignment accuracy of the typical aligner is higher than the alignment accuracy of a joint device, it is unnecessary to take special measures to increase the alignment accuracy during joint. Moreover, since pressing is performed at ordinary temperature, the alignment marks on the electrode substrate are not deformed by heating. Hence, it is possible to form an array of microstructural bodies, such as micromirrors, at high accuracy relative to the fixed electrodes. In contrast to a case in which the formed microstructural body array is joined to the electrode substrate, unnecessary stress is not produced in the microstructural body array. Therefore, the microstructural bodies will not be ruptured during joint.

FOURTH EXAMPLE

Figure 8A:
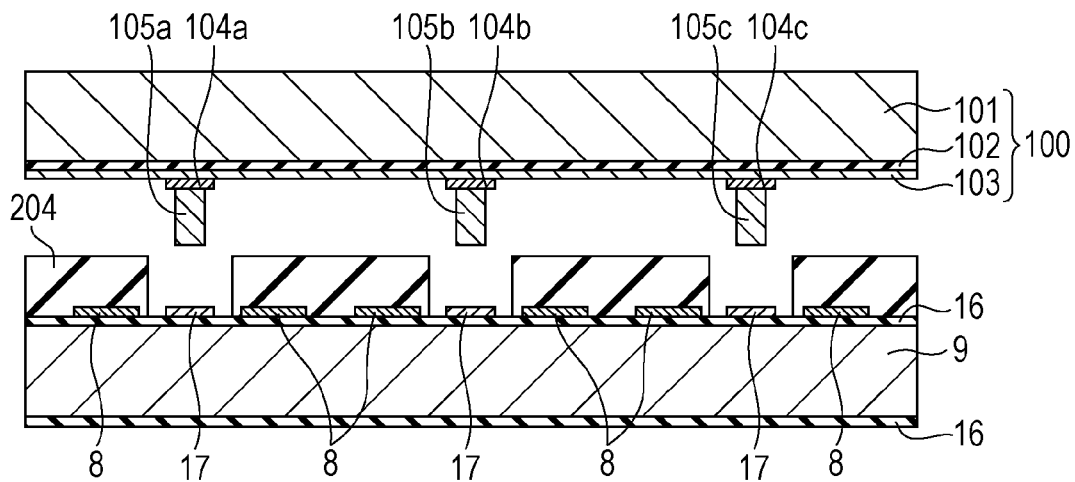
FIGS. 8A, 8B, and 8C illustrate a microstructural body array production method according to a fourth example of the present invention.
Figure 8B:
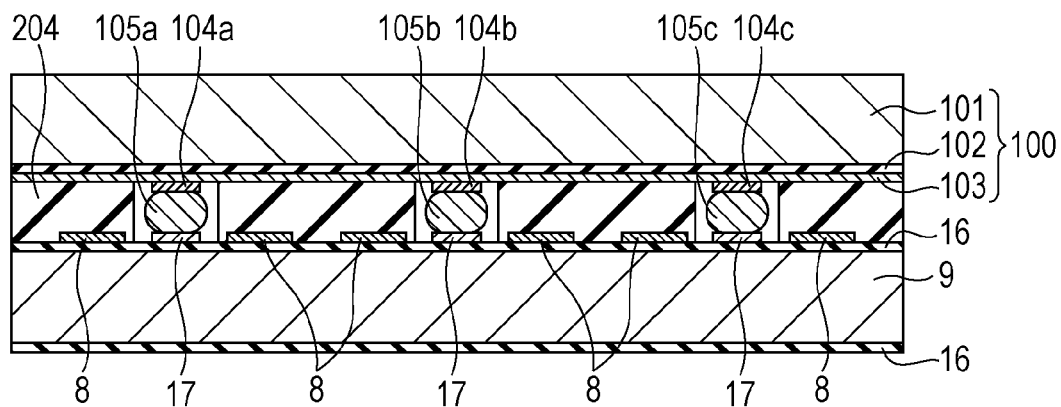
Figure 8C:
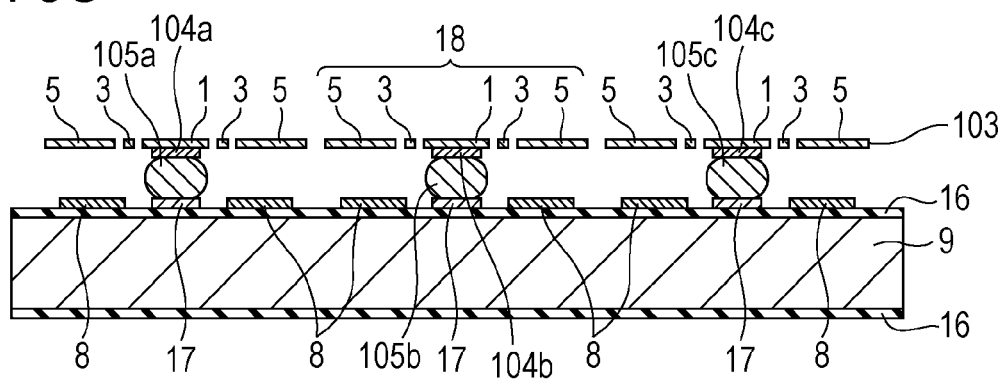

Next, a production method for a microstructural body array according to a fourth example of the present invention will be described with reference to FIGS. 8A to 8C. FIGS. 8A to 8C are cross-sectional views of microstructural bodies taken along line IB-IB of FIG. 1A. Here, a description will also be given of a procedure for producing a microstructural body array including three microstructural bodies. Portions having the same functions as those adopted in the above-described embodiment and examples are denoted by the same reference numerals, and detailed descriptions thereof are omitted. The fourth example is different from the third example in the following points.

In the fourth example, fixed electrodes 8 and pads (receiving portions) 17 are formed on an electrode substrate 9 by wet etching, and spacers 204 are then formed to define a space between an SOI substrate 100 and the electrode substrate 9. The spacers 204 are formed of SiO₂ by plasma-CVD. The thickness of the SiO₂ spacers 204 needs to be smaller than the height of Au bumps 105 crushed with a sufficient joint strength. This can accurately define the space between the SOI substrate 100 and the electrode substrate 9 by the height accuracy of the spacers 204 even if there are variations in height among the Au bumps 105. As a result, when a microstructural body array is formed, variation in deflection angle among the microstructural bodies, such as micromirrors, with respect to the same driving voltage can be reduced.

Next, as illustrated in FIG. 8B, the SOI substrate 100 and the electrode substrate 9 are pressurized at ordinary temperature so as to press the bumps 105 against the receiving portions 17, and are thereby joined to form a space therebetween. After that, a handle layer 101 and a SiO₂ layer 102 of a SOI wafer of the SOI substrate 100 are removed by dry etching, thinning is performed so that only a device layer 103 is left, as illustrated in FIG. 8C, and the spacers 204 are then removed. When the spacers 204 are provided, seed portions 104, the bumps 105, the fixed electrodes 8, and the receiving portions 17 are not exposed to etching gas for a long time in this thinning step. Thus, the spacers 204 also function as etching protective layers. In the above-described production method, the spacers may be formed on the device substrate.

FIFTH EXAMPLE

Figure 9:
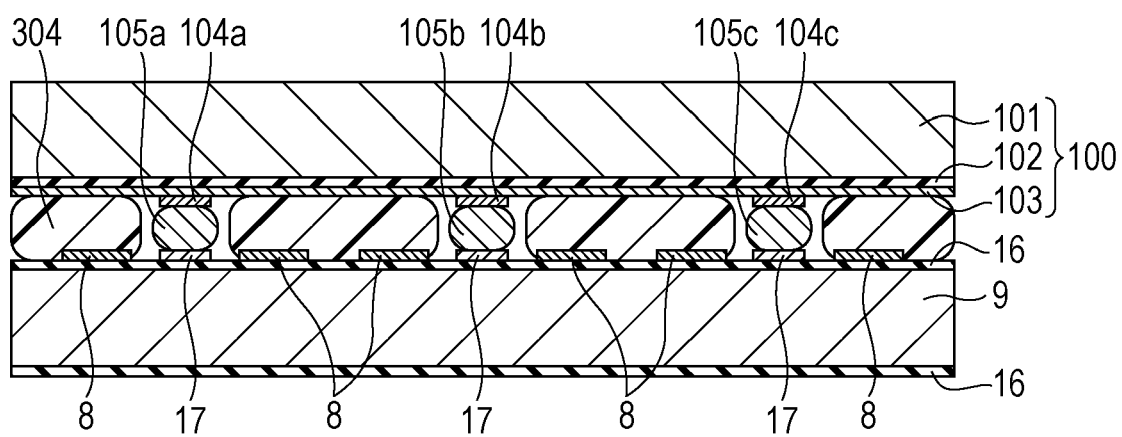
FIG. 9 illustrates a microstructural body array production method according to a fifth example of the present invention.

A fifth example of the present invention will be described with reference to FIG. 9. In the fifth example, spacers 304 are formed of a resin material such as polyimide, unlike the SiO₂ spacers 204 illustrated in FIGS. 8A to 8C. The fifth example is the same as the fourth example in other points.

In the fifth example, polyimide is applied by spin coating, and a pattern of the spacers 304 is formed thereon by photolithography. The patterned polyimide is finally cured by baking at 350° C. for one hour or more so as to stabilize the shape and to enhance the chemical resistance. Next, similarly to the fourth example, bumps 105 and receiving portions 17 are subjected to an activation step so as to be joined, and are aligned by alignment marks (not illustrated) provided on the substrates. In this case, the etching rate of the spacers 304 of polyimide with respect to argon plasma is higher than the spacers of $SiO_2$. Hence, it is necessary, in consideration of the etching rate, that the initial layer thickness of polyimide is set to be large. After that, a device substrate 100 and an electrode substrate 9 are mechanically, electrically, and firmly joined while forming a space therebetween. Similarly to the fourth example, the polyimide spacers 304 also function as etching protective layers during removal of a handle layer 101 and an $SIO_2$ layer 102 of the device substrate 100 in a later thinning step. Further, since polyimide can be removed by $O_2$, the spacers can be more easily removed than in the fourth example. In addition, etching damage to other materials can be reduced, and this increases the number of choices of electrode materials.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-058727 filed Mar. 16, 2010, which is hereby incorporated by reference herein in its entirety.

What is claimed is:

1. A microstructural body comprising:
   a substrate;
   a support portion;
   one post that fixes the support portion to the substrate;
   a frame-shaped movable portion provided around an outer periphery of the support portion; and
   an elastic support portion that elastically connects the movable portion and the support portion,
   wherein the elastic support portion includes:
   a frame-shaped connecting portion provided around the outer periphery of the support portion;
   a first torsion spring; and
   a second torsion spring,
   wherein the first torsion spring supports the connecting portion such that the connecting portion undergoes torsional displacement around a first torsion axis relative to the support portion, and the second torsion spring supports the movable portion such that the movable portion undergoes torsional displacement around a second torsion axis relative to the connecting portion, and
   wherein the movable portion includes a movable electrode, and the movable portion and a fixed electrode on the substrate form a capacitor having variable electrostatic capacitance.

2. The microstructural body according to claim 1,
   wherein the first torsion axis and the second torsion axis are provided in one plane, and
   wherein, when a direction of the normal to the plane is a vertical direction, a spring constant in the vertical direction of the connecting portion is larger than spring constants in the vertical direction of the first torsion spring and the second torsion spring.

3. The microstructural body according to claim 2, wherein a projection area of the movable portion in the vertical direction is larger than a projection area of the elastic support portion in the vertical direction.

4. The microstructural body according to claim 1,
   wherein the movable portion has a reflecting surface that reflects light, and
   wherein the light is deflected by applying voltage between the movable electrode of the movable portion and the fixed electrode on the substrate so as to drive the movable portion.

5. The microstructural body according to claim 1, wherein a plurality of structural bodies each including the support portion, the post, the movable portion, and the elastic support portion are arranged on the substrate.

6. The microstructural body according to claim 1, wherein the elastic support portion is formed of single-crystal silicon.

7. The microstructural body according to claim 1, wherein the post contains gold.

* * * * *